(12) United States Patent
Zhang et al.

(10) Patent No.: US 11,563,003 B2
(45) Date of Patent: Jan. 24, 2023

(54) FIN TOP HARD MASK FORMATION AFTER WAFER FLIPPING PROCESS

(71) Applicant: INTERNATIONAL BUSINESS MACHINES CORPORATION, Armonk, NY (US)

(72) Inventors: Chen Zhang, Guilderland, NY (US); Tenko Yamashita, Schenectady, NY (US); Joshua M. Rubin, Albany, NY (US); Brent Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 17/248,330

(22) Filed: Jan. 20, 2021

(65) Prior Publication Data

US 2022/0231021 A1   Jul. 21, 2022

(51) Int. Cl.

| H01L 27/092 | (2006.01) |
| H01L 29/06 | (2006.01) |
| H01L 29/423 | (2006.01) |
| H01L 29/49 | (2006.01) |
| H01L 29/786 | (2006.01) |
| H01L 21/02 | (2006.01) |
| H01L 21/8238 | (2006.01) |
| H01L 29/66 | (2006.01) |

(52) U.S. Cl.
CPC .... *H01L 27/0922* (2013.01); *H01L 21/02603* (2013.01); *H01L 21/823807* (2013.01); *H01L 21/823842* (2013.01); *H01L 21/823864* (2013.01); *H01L 29/0673* (2013.01); *H01L 29/42392* (2013.01); *H01L 29/4908* (2013.01); *H01L 29/66545* (2013.01); *H01L 29/66553* (2013.01); *H01L 29/66742* (2013.01); *H01L 29/78696* (2013.01)

(58) Field of Classification Search
CPC .......... H01L 27/0922; H01L 21/02603; H01L 21/823807; H01L 21/823842; H01L 21/823864; H01L 29/0673; H01L 29/42392; H01L 29/4908; H01L 29/66545; H01L 29/66553; H01L 29/66742; H01L 29/78696
USPC ....................................................... 257/351
See application file for complete search history.

(56) References Cited

U.S. PATENT DOCUMENTS

| 7,683,428 B2 | 3/2010 | Chidambarrao |
| 8,294,511 B2 | 10/2012 | Juengling |
| 8,716,091 B2 | 5/2014 | Cohen |
| 9,064,849 B2 | 6/2015 | Zhu |
| 9,177,890 B2 | 11/2015 | Du |

(Continued)

*Primary Examiner* — Tong-Ho Kim
(74) *Attorney, Agent, or Firm* — Samuel A. Waldbaum

(57) ABSTRACT

A method comprising forming at least one fin on a substrate, wherein the at least one fin has a first section and a second section. Forming a separating layer on the substrate to isolate the second section of the fin from the first section of the fin. Forming as first set of electrical components on the first section of the at least one fin. Flipping the substrate over and removing the substrate to expose a surface of the second section of the at least one fin. Removing a portion of the second section of the at least one fin, whereby removing a portion of the second section a trench is created between sections of the separating layer and an exposed portion of the at least one fin and forming a hard mask in the trench.

24 Claims, 13 Drawing Sheets

(56) References Cited

U.S. PATENT DOCUMENTS

| | | |
|---|---|---|
| 9,659,963 B2 | 5/2017 | Cheng |
| 10,217,674 B1 | 2/2019 | Hook |
| 10,269,905 B2 | 4/2019 | Radens |
| 10,276,453 B1 | 4/2019 | Wu |
| 10,636,791 B1 | 4/2020 | Rubin |
| 10,700,067 B2 | 6/2020 | Rubin |
| 10,770,460 B2 | 9/2020 | Rubin |
| 2016/0043074 A1 | 2/2016 | Hurley |
| 2020/0111798 A1* | 4/2020 | Paul .................. H01L 21/76895 |
| 2020/0119011 A1 | 4/2020 | Rubin |
| 2020/0119012 A1* | 4/2020 | Rubin .................. H01L 27/092 |
| 2020/0152629 A1 | 5/2020 | Rubin |
| 2020/0294998 A1* | 9/2020 | Li ......................... H01L 23/481 |

\* cited by examiner

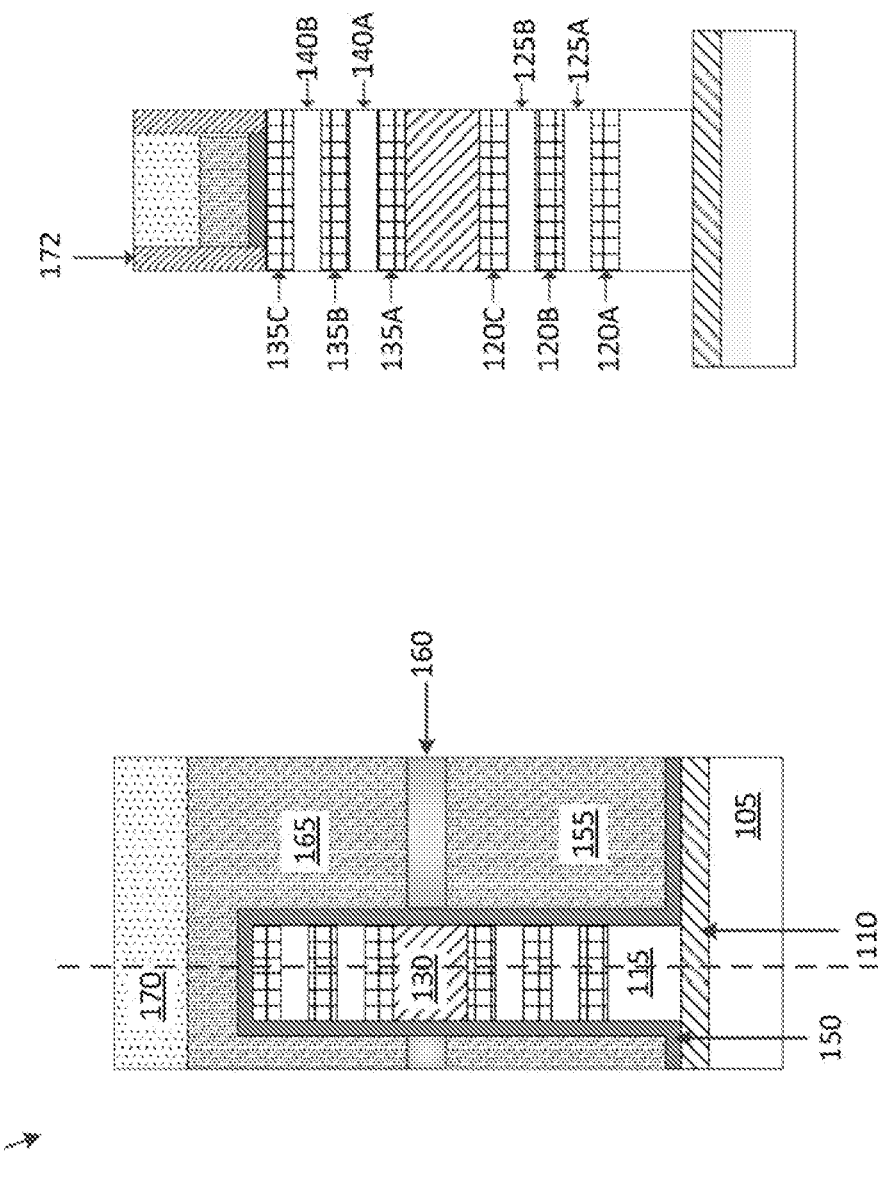

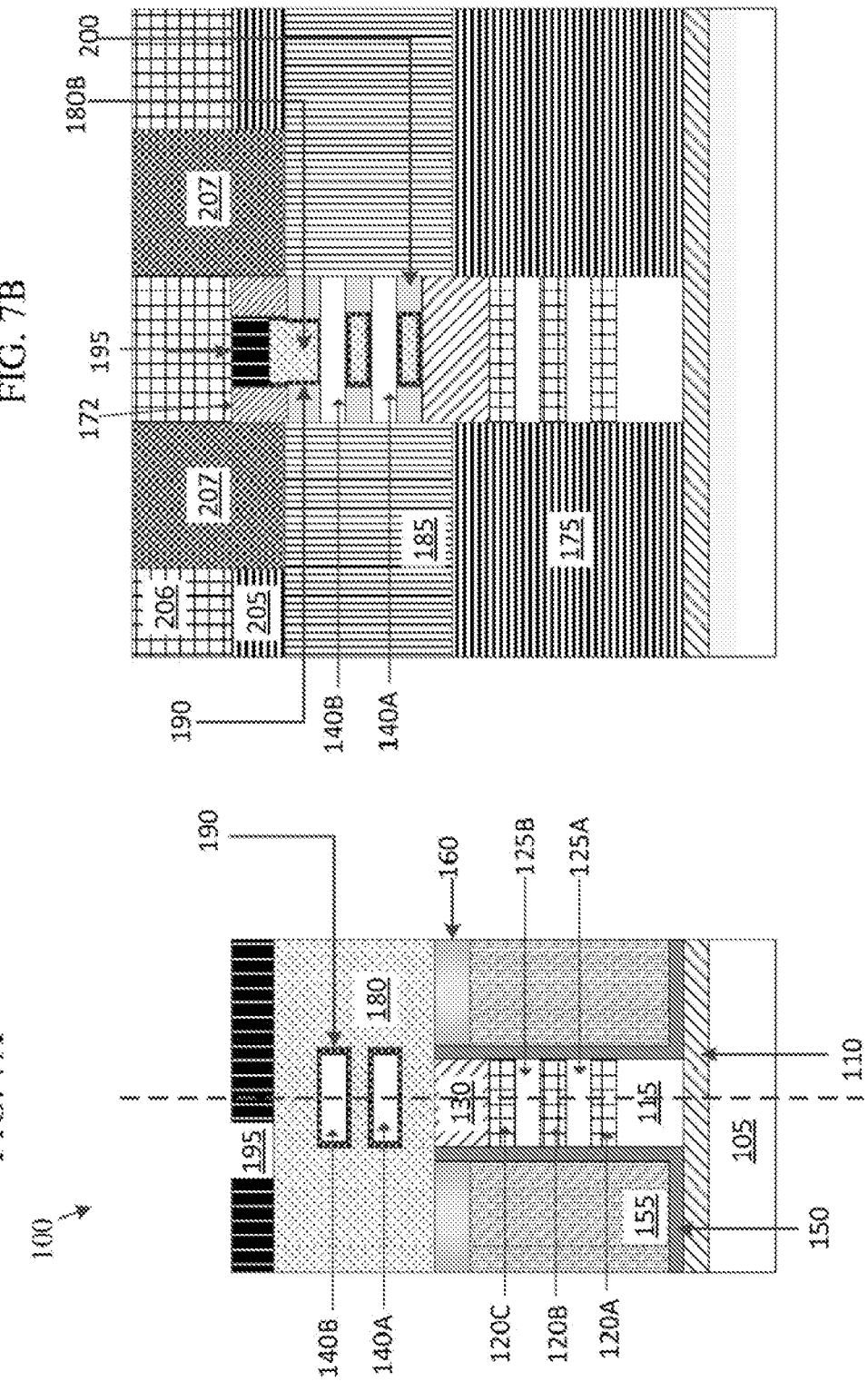

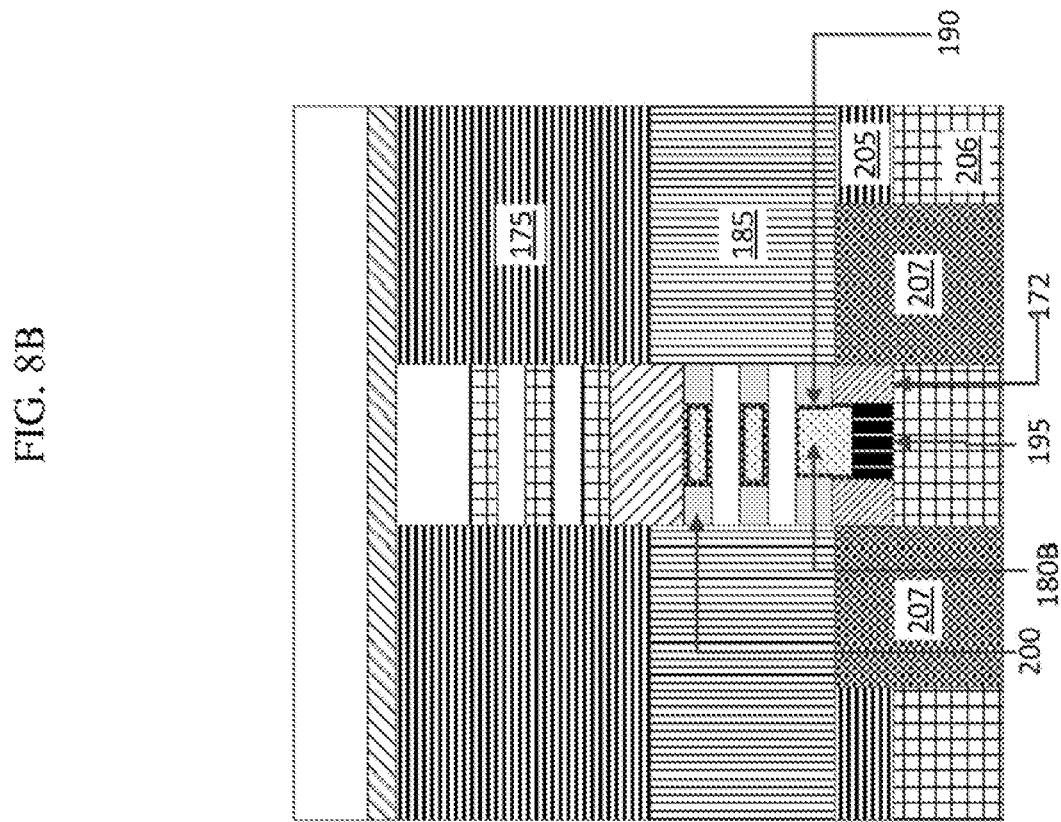
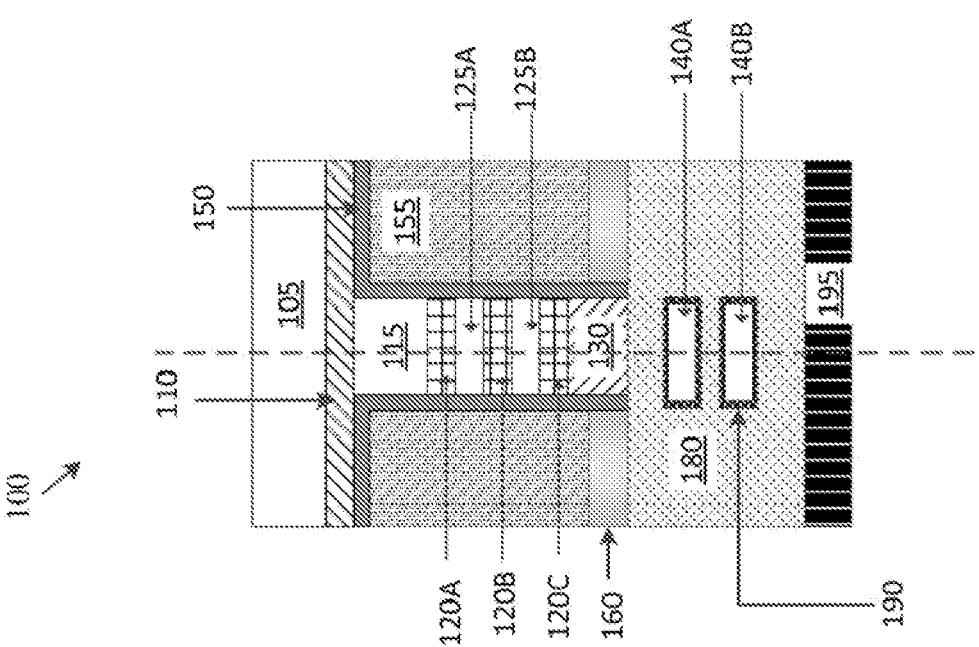

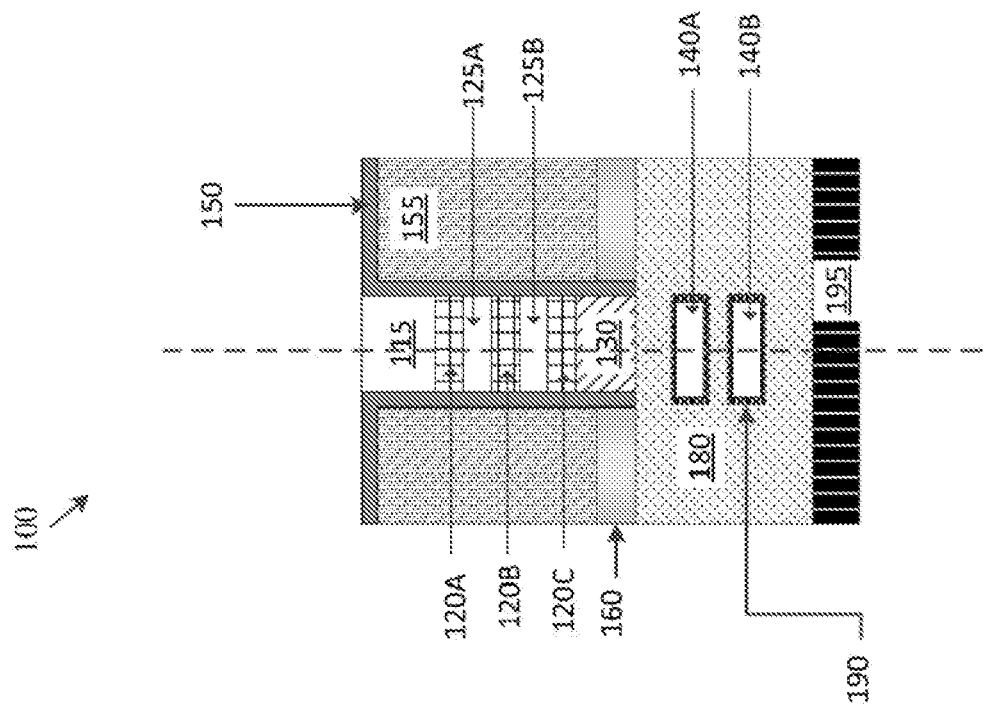

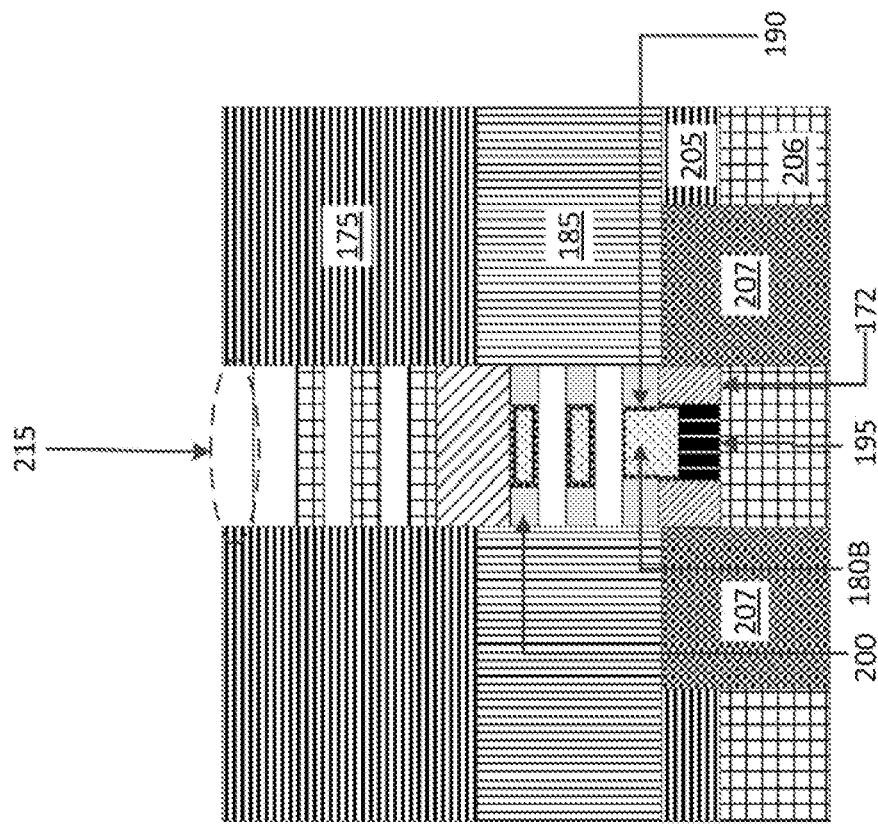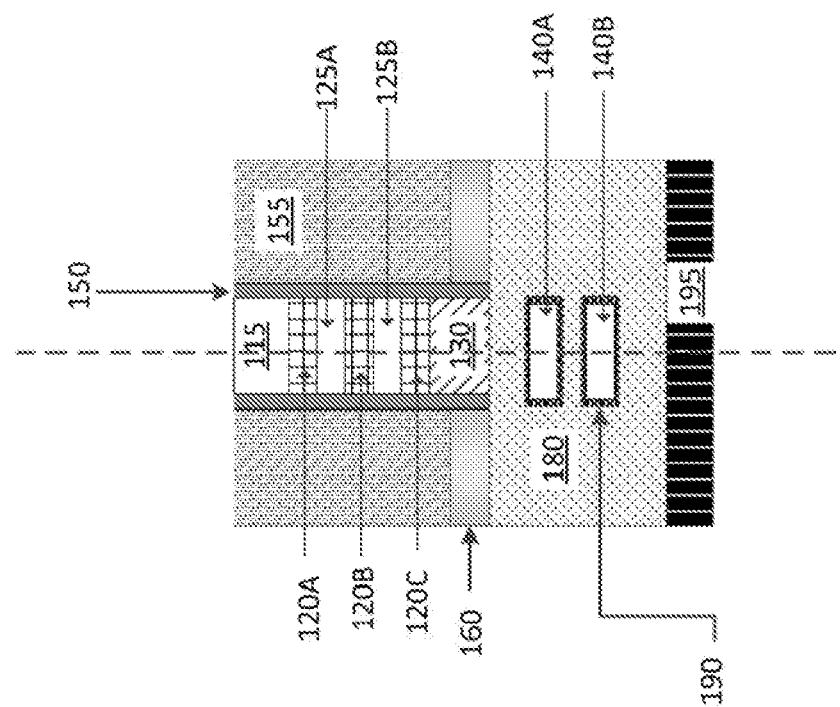

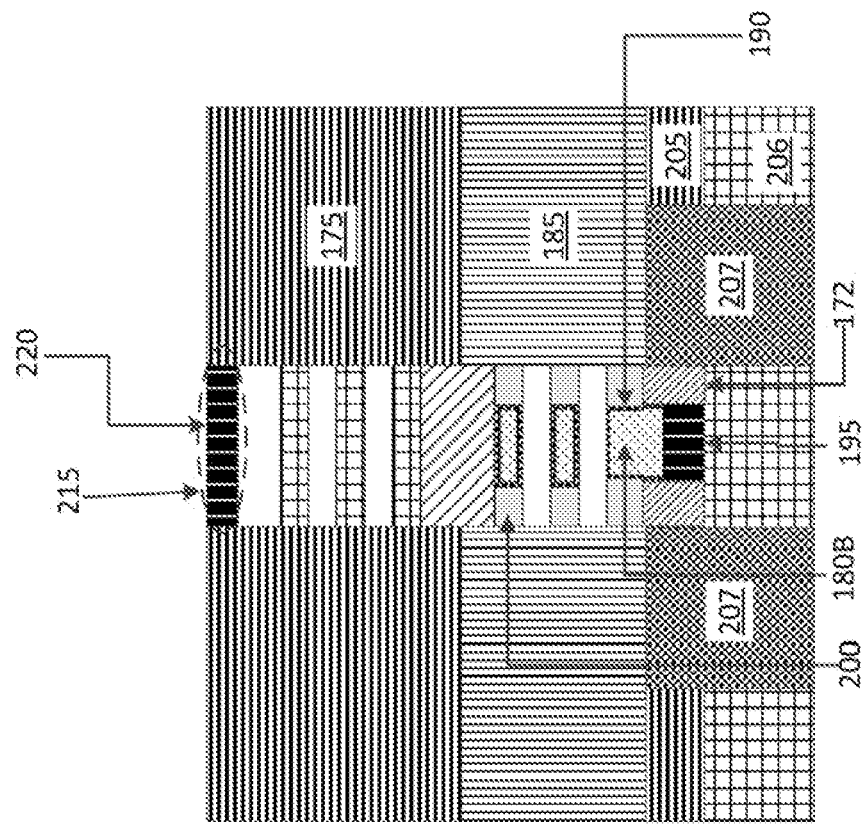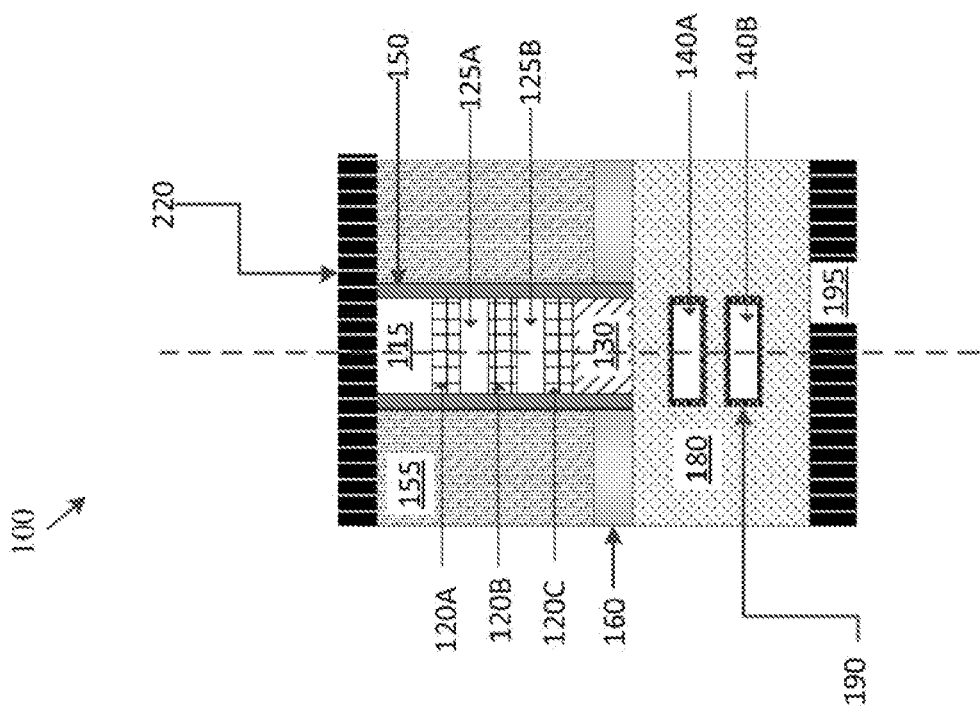

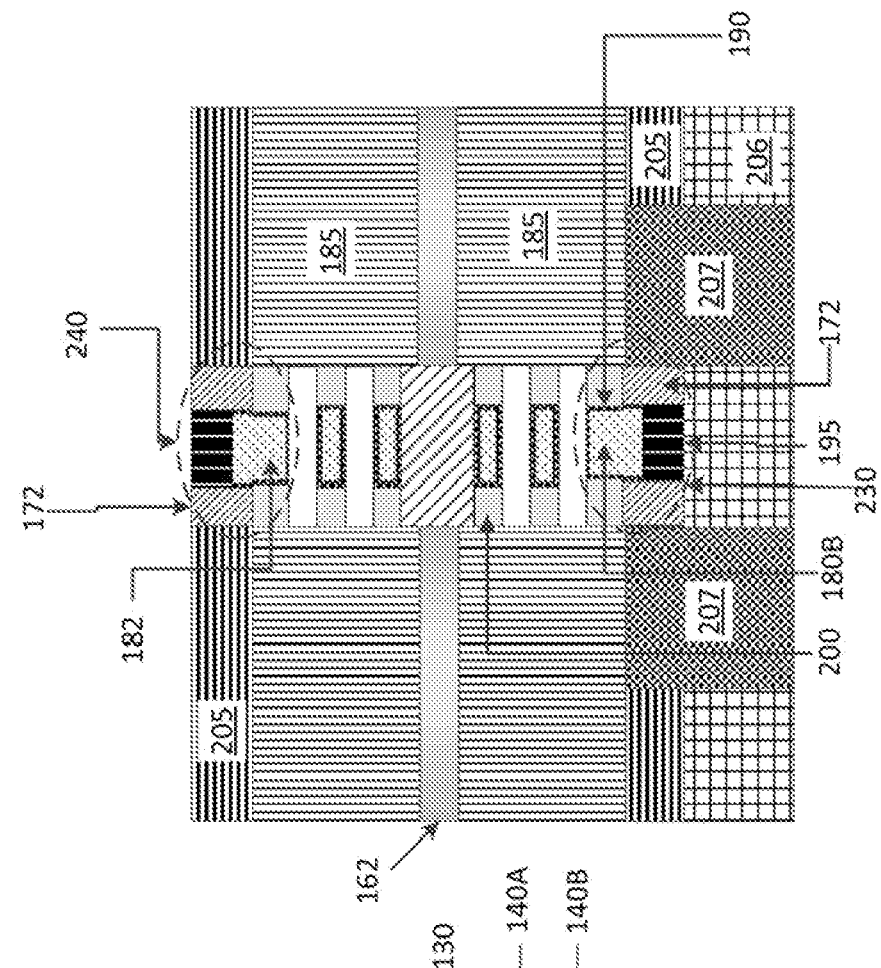
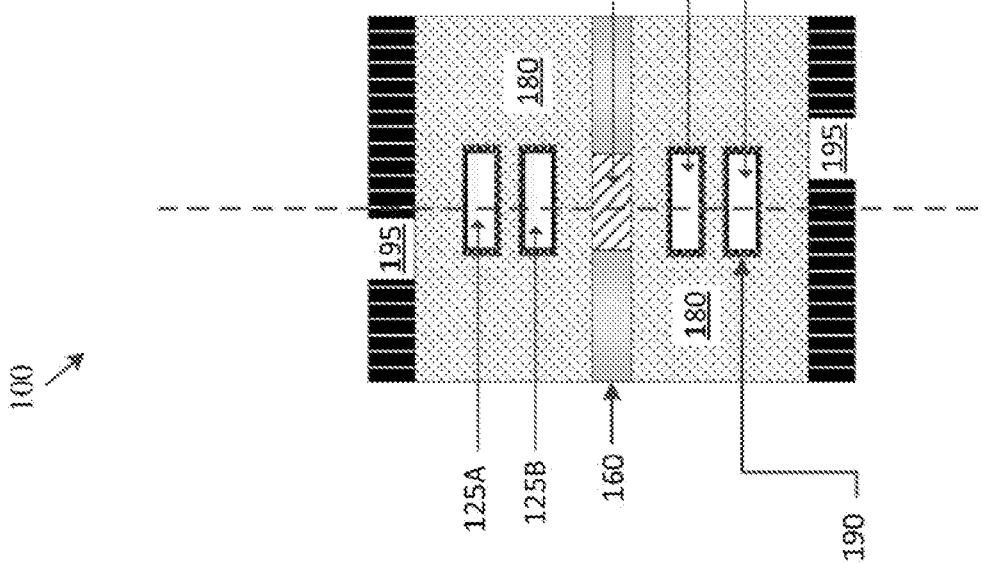
FIG. 12A
FIG. 12B

FIN TOP HARD MASK FORMATION AFTER WAFER FLIPPING PROCESS

BACKGROUND

The present invention relates generally to the field of multilayered fins, and more particularly to formation of multilayered fins having a high aspect ratio.

Initially a hard mask is formed on top of the substrate, where the hard mask acts as a bottom layer of a high aspect ratio fin (e.g. the fin is taller than it is wider). The different layers that will make up the fins are formed on top of the hard mask (e.g. SiN), so when the fins are etched from the layers, each fin has a hard mask as its bottom layer.

BRIEF SUMMARY

Additional aspects and/or advantages will be set forth in part in the description which follows and, in part, will be apparent from the description, or may be learned by practice of the invention.

A method comprising forming at least one fin on a substrate, wherein the at least one fin has a first section and a second section. Forming a separating layer on the substrate to isolate the second section of the fin from the first section of the fin, wherein the first section of the fin can be processed while the second section of the fin has been isolated. Forming as first set of electrical components on the first section of the at least one fin. Flipping the substrate over and removing the substrate to expose a surface of the second section of the at least one fin. Removing a portion of the second section of the at least one fin, whereby removing a portion of the second section a trench is created between sections of the separating layer and an exposed portion of the at least one fin and forming a hard mask in the trench.

In accordance with an aspect of the present invention, wherein the first section is the top portion of the at least one fin, and the second section is the bottom portion of the at least one fin.

In accordance with an aspect of the present invention, forming a second set of electrical components on the second section of the at least one fin.

In accordance with an aspect of the present invention, wherein the first set of electrical components are formed using a first gate metal, wherein the second set of electrical components are formed using a second gate metal, and wherein the first gate metal and the second gate metal are different metals.

In accordance with an aspect of the present invention, wherein the first set of electrical components are formed using a first gate metal, wherein the second set of electrical components are formed using a second gate meta, and wherein the first gate metal and the second gate metal are the same metal.

A method comprising forming at least one fin on a substrate, wherein the at least one fin is formed by forming a plurality of different layers on top of each other, wherein the at least one fin has a first section and a second section, wherein the plurality of different layers are epitaxially grown on the substrate. Forming a separating layer on the substrate to isolate the second section of the fin from the first section of the fin, wherein the first section of the fin can be processed while the second section of the fin has been isolated. Forming as first set of electrical components on the first section of the at least one fin. Flipping the substrate over and removing the substrate to expose a surface of the second section of the at least one fin. Removing a portion of the second section of the at least one fin, whereby removing a portion of the second section a trench is created between sections of the separating layer and an exposed portion of the at least one fin and forming a hard mask in the trench.

In accordance with an aspect of the present invention, wherein the first section is the top portion of the at least one fin, and the second section is the at least one fin.

In accordance with an aspect of the present invention, forming a second set of electrical components on the second section of the at least one the at least one high aspect ratio fin.

In accordance with an aspect of the present invention, wherein the removing a portion of the at least one high aspect ratio fin removes a portion of the first layer of the plurality of different layers, such that, the trench is formed in the first layer.

In accordance with an aspect of the present invention, wherein the first set of electrical components are formed using a first gate metal, wherein the second set of electrical components are formed using a second gate metal, and wherein the first gate metal and the second gate metal are different metals.

In accordance with an aspect of the present invention, wherein the first set of electrical components are formed using a first gate metal, wherein the second set of electrical components are formed using a second gate meta, and wherein the first gate metal and the second gate metal are the same metal.

An apparatus comprising a fin, wherein the fin is divided into a first section and a second section. A first gate located on the first section, wherein the first gate is a first type of electrical gate. A second gate located on the second section, wherein the second gate is a second type of electrical gate, wherein the first gate and the second gate are different.

In accordance with an aspect of the present invention, an electrical contact located on the second section, wherein the electrical contacts are aligned with the second gate.

In accordance with an aspect of the present invention, wherein the first gate is comprised of a first gate metal and the second gate is comprised of a second gate metal, and wherein the first gate metal and the second gate metal are different.

In accordance with an aspect of the present invention, further comprising a first spacer material located on the sides of the first gate and a second spacer material located on the sides of the second gate, wherein the first spacer material and the second spacer material are comprised of a low-k dielectric material.

In accordance with an aspect of the present invention, further comprising at least one first contact connected to the first spacer material.

In accordance with an aspect of the present invention, further comprising at least one second contact connected to the second spacer material.

An apparatus comprising a fin, wherein the fin has a first section and a second section. A first gate located on the first section, wherein the first gate is a first type of electrical gate. At least one first inner spacer is located on the first section, wherein the at least one first inner spacer separates the first gate from a first doped layer. A second gate located on the second section, wherein the second gate is a second type of electrical gate, wherein the first gate and the second gate are different. At least one second inner spacer are located the second section, wherein the at least one second inner spacer separates the second gate from a second doped layer.

In accordance with an aspect of the present invention, a first hardmask located on top of the first gate and a first spacer material located on the sides of the first gate and the first hardmask.

In accordance with an aspect of the present invention, a second hardmask located on top of the second gate and a second spacer material located on the sides of the second gate and the second hard mask.

In accordance with an aspect of the present invention, wherein the at least one first inner spacer and the at least one second inner spacer are comprised of a first low-k dielectric material.

In accordance with an aspect of the present invention, wherein the first spacer material and the second spacer material are comprised of a second low-k dielectric material and wherein the first low-k dielectric material and the second low-k dielectric material are different.

In accordance with an aspect of the present invention, a first electrical contact located on the first section, wherein the first electrical contact extends along the surface of the first spacer material, such that, the first electrical contact overlaps with the first gate and the first hardmask.

In accordance with an aspect of the present invention, a second electrical contact located on the second section, wherein the second electrical contact extends along the surface of the second spacer material, such that, the second electrical contact overlaps with the second gate and the second hardmask.

In accordance with an aspect of the present invention, wherein the first gate is a gate first structure, and the second gate is a replacement metal gate structure.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 5A illustrates the cross section of the nanosheet, in accordance with an embodiment of the present invention.

FIG. 5B illustrates the cross section of the fin after the fin has been etched, in accordance with the embodiment of the present invention.

FIGS. 7A and 7B illustrates the top section of the fin in the nanosheet to form the desired structures, in accordance with an embodiment of the present invention.

FIGS. 8A and 8B illustrate the flipped over the nanosheet, in accordance with an embodiment of the present invention.

FIGS. 9A and 9B illustrates the removal of the base substrate and the buried oxide layer, in accordance with an embodiment of the present invention.

FIG. 10A illustrates removal of material from the flipped nanosheet, in accordance with an embodiment of the present invention.

FIG. 10B illustrates a formation of a trench at the exposed top of the flipped nanosheet, in accordance with an embodiment of the present invention.

FIG. 11A illustrates the formation of a hard mask on the exposed surface of the nanosheet, in accordance with an embodiment of the present invention.

FIG. 11B illustrates filling the trench with the hard mask material, in accordance with an embodiment of the present invention.

FIGS. 12A and 12B illustrates the processing of the flipped over nanosheet, in accordance with an embodiment of the present invention.

DETAILED DESCRIPTION

Figure 1:
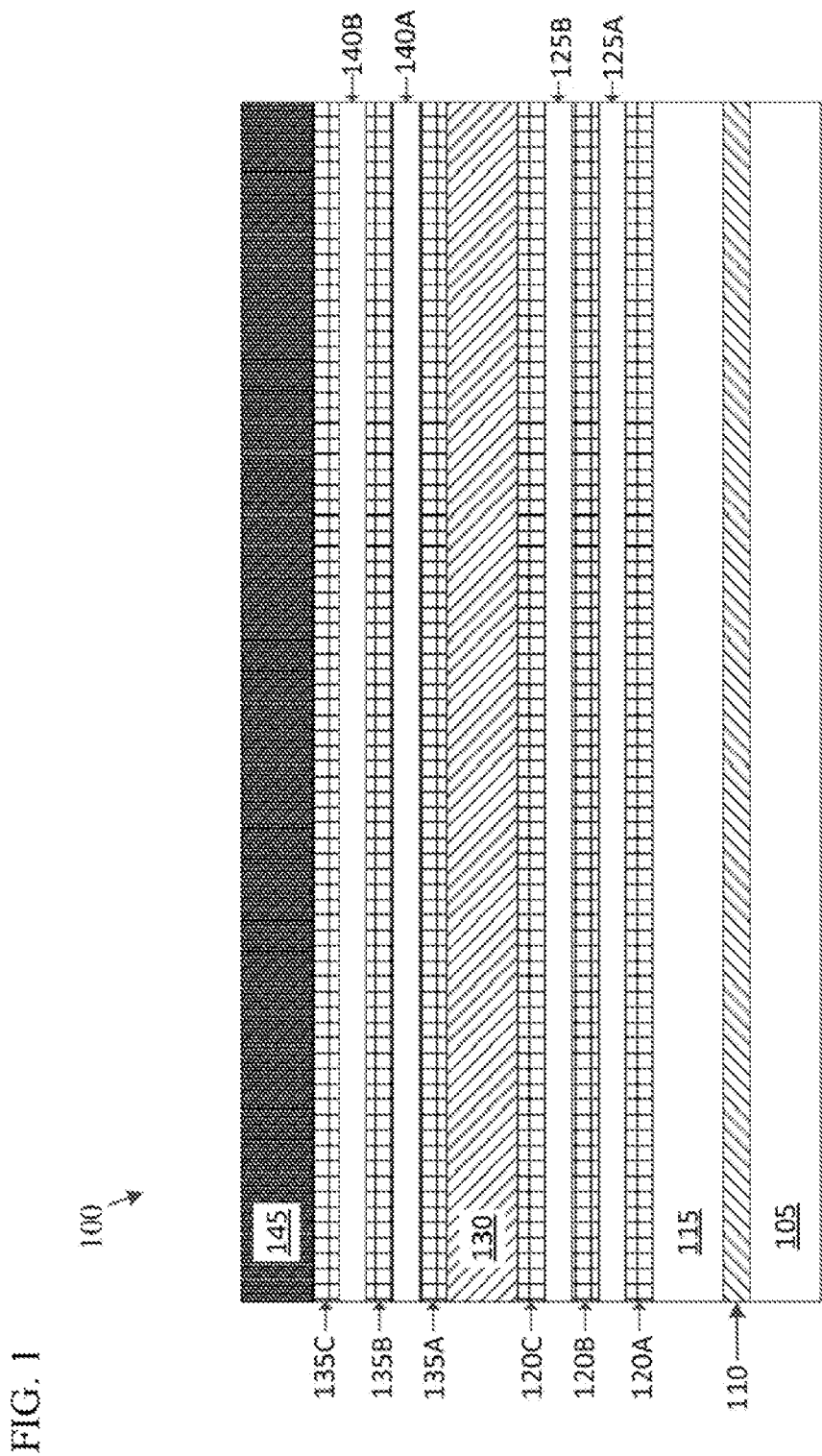
FIG. 1 illustrates a cross section of a nanosheet, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e. two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g. aluminum, copper, etc.) and insulators (e.g. various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. Embodiments of the present invention are generally directed to a method for a forming a self-aligning hard mask on a fin after the fin has been flipped over. Initially multiple layers are formed on a buried oxide layer or directly on a substrate, where the multiple layers are the starting layers of the device. The layers are etched to form at least one fin, where the fin can have a high aspect ratio, i.e. the fin is taller than wider. The fin is divided into two sections (top section and bottom section) by filling a bottom section of the fin. The top section is then processed to form the necessary electrical components and connections, e.g. gates. Once the top section is finished being processed, then the substrate is flipped over, and the substrate is removed. Then a portion of the now exposed fin is removed to form a trench, such that when a hard mask material is formed on the exposed surface, then the hard mask material would fill the trench. Therefore, the hard mask will self-align to the now flipped over fin (i.e. the previous bottom section). Once the hard mask is formed on the fin, then the bottom section is then processed to form the necessary electrical components. The electrical components formed in the bottom section can mirror similar components formed in the top section of the fin. Additionally, the electrical components formed in the bottom section can be different electrical components than the electrical components formed in the top section.

FIG. 1 illustrates a cross section of a nanosheet, in accordance with an embodiment of the present invention. The figures illustrate a formation of a nanosheet; however, this is meant to be an example of a device where at least one high aspect ratio fin is formed and processed. A high aspect ratio fin is a fin that is taller than it is wider.

FIG. 1 illustrates a multilayer device 100 that includes a plurality of layers. The initial base of the multilayer device 100 includes an underlying layer 105 which can be, for example, a Si substrate. A buried oxide layer 110 is formed on top of the underlying layer 105. Since the example is a nanosheet, each of the layers of the multilayered device 100 is epitaxially grown to control the crystalline structure of each of the layers. The layers can be formed by other deposition techniques for different types of devices. A first layer 115 is formed on the buried oxide layer 110. The first layer 115 can be, for example, Si. A second layer 120A is formed on top of the first layer 115. A third layer 125A is formed on top of the second layer 120. A second layer 120B is formed on top of the third layer 125A. An additional third layer 125B is formed on top of the second layer 120B. The third layer 125A and 125B can be, for example, Si. An additional second layer 120C is formed on top of the third layer 125B. The second layer 120A, 120B, and 120C can be, for example, SiGe 35%. An intermediate layer 130 is formed on top of the second layer 120C. The intermediate layer can be, for example, SiGE 65%. A fourth layer 135A is formed on top of the intermediate layer 130. A fifth layer 140A is formed on top of the fourth layer 135A. A fourth layer 135B is formed on top of the fifth layer 140A. A fifth layer 140B is formed on top of the fourth layer 135B and a fourth layer 135C is formed on top of the fifth layer 140B. The fourth layer 135A, 135B, and 135C can be, for example, SiGe 35%. The fifth layer 140A and 140B can be, for example, Si. A cap layer 145 is formed on top of the fourth layer 135C. The cap layer 145 can be, for example, $Si_3N_4$ or can be comprised of multiple layers.

Figure 2:
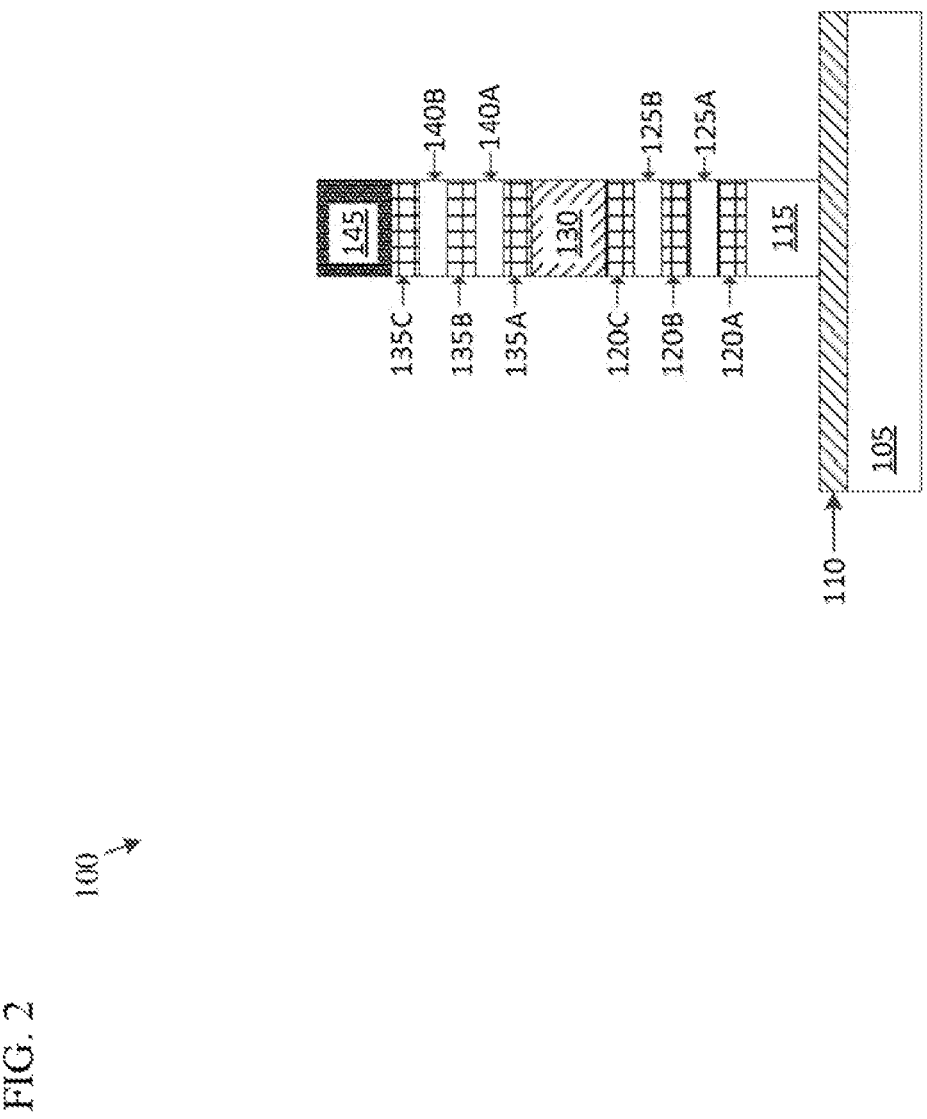
FIG. 2 illustrates the formation of the fins for the nanosheet, in accordance with an embodiment of the present invention.

FIG. 2 illustrates the formation of the fin for the nanosheet, in accordance with an embodiment of the present invention. The multiple layer device 100 is etched to form the high aspect ratio fin as illustrated by FIG. 2. A high aspect ratio fin is a fin that is taller than it is wider. The multiple layers can be etched through a reactive ion etching that allows for etching straight downwards.

Figure 3:
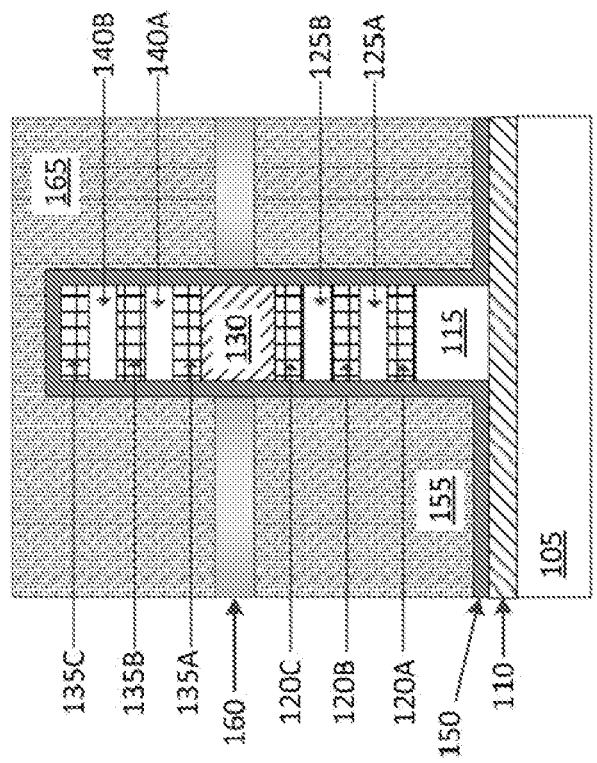
FIG. 3 illustrates the formation of additional layers on the nanosheet, in accordance with an embodiment of the present invention.

FIG. 3 illustrates the formation of additional layers on the nanosheet, in accordance with an embodiment of the present invention. The intermediate layer 130 is converted from SiGe 65% to a dielectric material by utilizing known techniques. A covering layer 150 is formed on the exposed layers of the high aspect ratio fin. A first dummy gate layer 155 is formed on a lower section. A dividing layer 160 is formed on top of the first dummy gate layer 155. The dividing layer 160 can be, for example, SiN. The dividing layer 160 divides the fin into a lower section and an upper section for processing. A second dummy gate layer 165 is formed on top of the dividing layer 160.

Figure 4B:
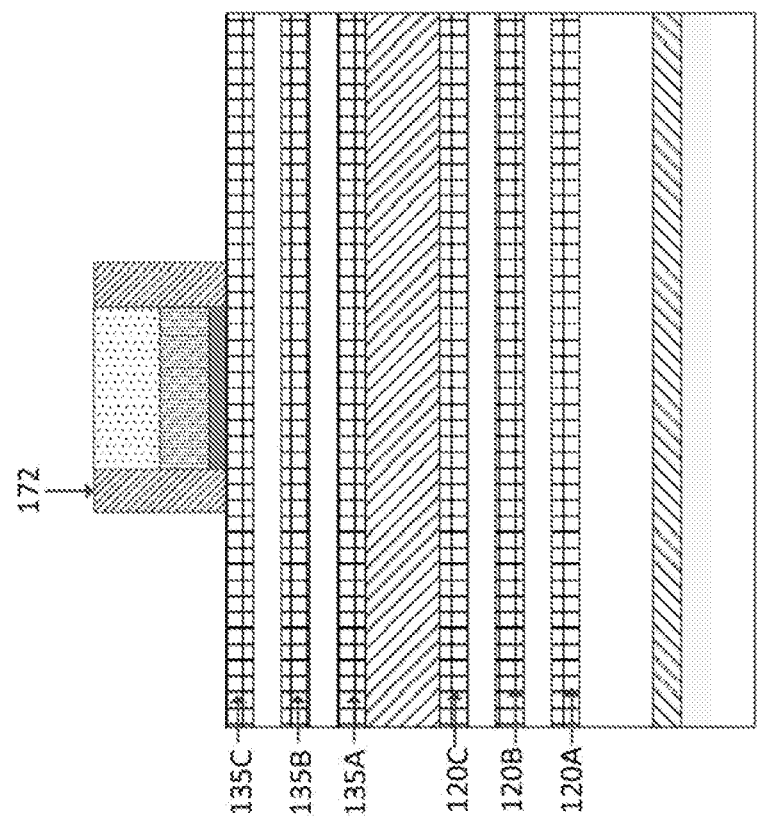
FIG. 4B illustrates a cross section of one of the fins of the nanosheet, in accordance with an embodiment of the present invention.
Figure 4A:
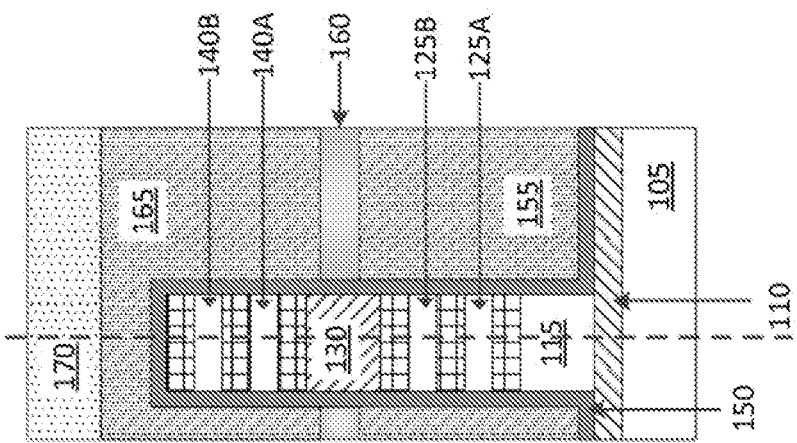
FIG. 4A illustrates the formation of a hard mask on the top of the nanosheet, in accordance with an embodiment of the present invention.

FIG. 4A illustrates the formation of a hard mask on the top of the nanosheet, in accordance with an embodiment of the present invention. A mask layer 170 is formed on top of the second dummy gate layer 165. FIG. 4B illustrates a cross section of one of the fins of the nanosheet, in accordance with an embodiment of the present invention. An aspect of the present invention is also that the dummy gate is patterned in a single step for the upper and lower devices, such that upper and lower dummy gates are aligned. Therefore, a single patterning for the fin, such that upper and lower devices are aligned and a single patterning for gate, such that upper and lower gates are aligned. The dashed line in FIGS. 4A, 5A, 6A, 7A, 8A, 9A, 10A, 11A, and 12A represents the cross section illustrated by FIGS. 4B, 5B, 6B, 7B, 8B, 9B, 10B, 11B, and 12B. A spacer material 172 is formed on the side surface of the covering layer 150, the dummy gate material, and the mask layer 170. The spacer material 172 can be comprised of a low-k dielectric material.

FIG. 5A illustrates the cross section of the nanosheet, in accordance with an embodiment of the present invention. The fin is etched to conform to the desired shape, but the etched shaped is not evident from the viewpoint of FIG. 5A. FIG. 5B illustrates the cross section of the fin after the fin has been etched, in accordance with the embodiment of the present invention. The fin is etched by RIE process to conform to the shape of the mask layer 170 and the spacer material 172.

Figure 6A:
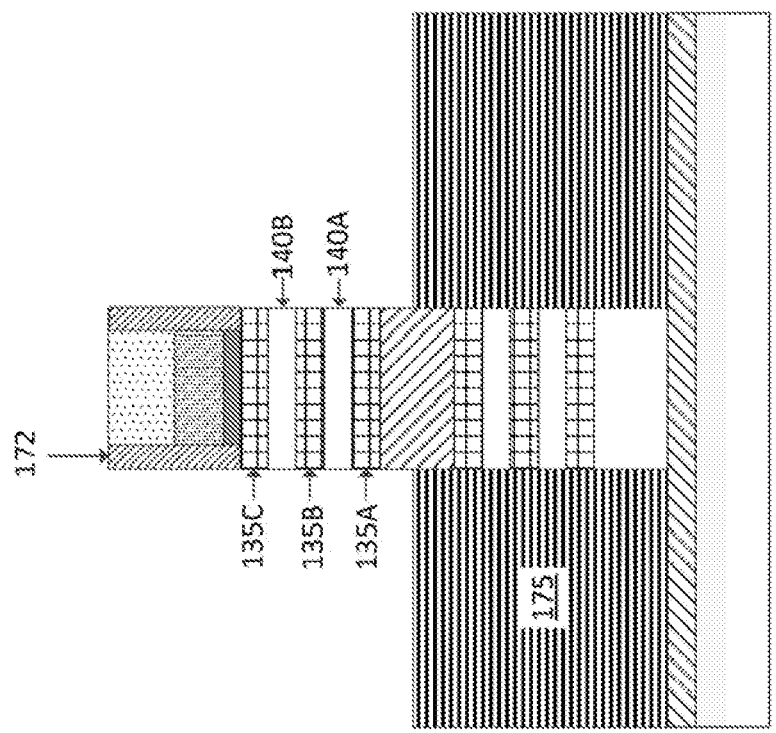
FIG. 6A illustrates the cross section of the nanosheet, in accordance with an embodiment of the present invention.
Figure 6B:
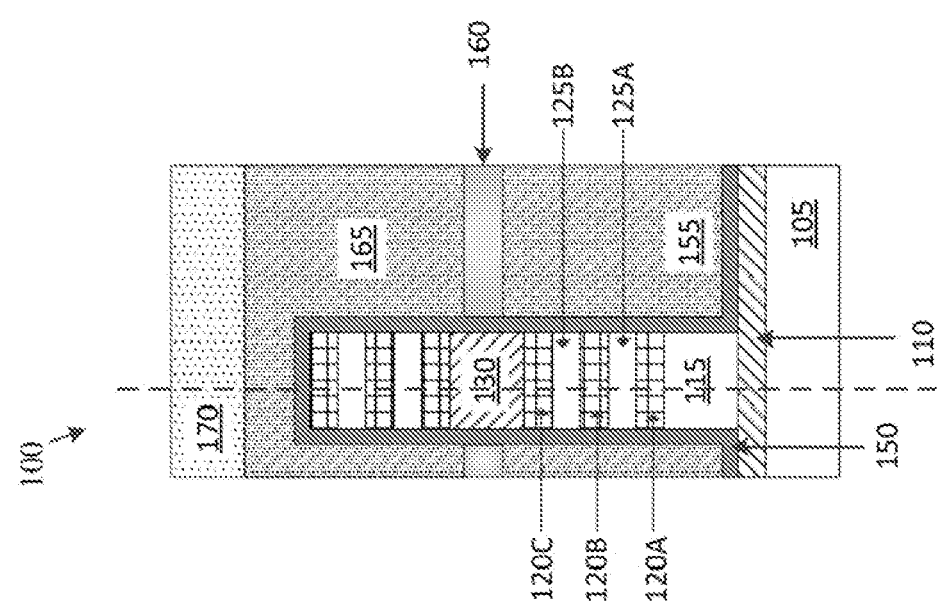
FIG. 6B illustrates filling the lower section of the fin in the nanosheet, in accordance with the embodiment of the present invention.

FIG. 6A illustrates the cross section of the nanosheet, in accordance with an embodiment of the present invention. A filling layer 175 is formed to cover the bottom section of the fin, which cannot be seen in this cross-section of the fin as illustrated by FIG. 6A. FIG. 6B illustrates sealing the lower section of the fin in the nanosheet, in accordance with the embodiment of the present invention. The filling layer 175 is formed on the buried oxide layer 110. The filling layer 175 protects the bottom section of the fin while leaving the upper section of the fin exposed.

FIGS. 7A and 7B illustrates the top section of the fin in the nanosheet to form the desired structures, in accordance with an embodiment of the present invention. The fourth layers 135A, 135B, and 135C are selectively recessed. The created recessed voids are filled by deposition techniques, for example, ALD, with a dielectric material, for example, SiN, to create an inner spacer structure 200, such that the recess is pinched off. The inner spacer structure 200 can be, for example, comprised of a low-k dielectric layer. The low-k dielectric material that comprises the inner spacer structure 200 can be the same low-k dielectric material as spacer 172 or it can be a different low-k dielectric material. A doped layer 185 is epitaxially grown on the filling layer 175, where the doped layer 185 is comprised of highly doped Si or SiGe. A second filling layer 205 is formed on top of the doped layer 185. The second filling layer 205 is deposited on the dope layer 185 and planarized to be relatively flush with cap 195, where the second filling layer 205 is comprised of a dielectric material. Cap 170 is removed to Selectively remove second dummy gate 165 and selectively remove remaining SiGe in the channel region to suspend fifth layers 140A and 140B (e.g. nanosheets). The gate stack 180 is formed on the dividing layer 160 and a dielectric liner 190 is formed to enclose different components. The gate stack 180 is formed of, for example, a first gate metal. The dielectric liner 190 can be, for example, a high-k dielectric. The gate stack 180 and optionally the high-k layer 190 are recessed back and fill with a cap 195, where the cap 195 is a comprised of a hardmask material, for example, SiN. For example, gate 180B can be a gate first type of gate (which is a known process for forming a gate, thus it is not shown) or it can be a replacement type of gate or it can be a different type of electrical component. Gate 180B can be formed by utilizing a first gate metal. A layer 206 is formed and the self-aligned contacts 207 are formed on top of the second filling layer 205, where the self-aligned contacts 207 are aligned with the spacer 172. The layer 206 can be, for example, a low-k dielectric layer. The dielectric material that comprises layer 206 is different than the dielectric material that comprises spacer 172.

FIGS. 8A and 8B illustrate the flipped over the nanosheet, in accordance with an embodiment of the present invention. The multilayered device 110 is flipped over by known means which are not described here within.

FIGS. 9A and 9B illustrates the removal of the base substrate and the buried oxide layer, in accordance with an embodiment of the present invention. The underlying layer 105 and the buried oxide layer 110 are removed by, for example, any combination of CMP, wafer grinding, polishing, RIE, and wet etch, or any other suitable process. The removal of the underlying layer 105 and the buried oxide layer 110, which served as an etch stop layer, exposes the bottom of the first layer 115, the covering layer 150, and the filling layer 175.

FIG. 10A illustrates removal of material from the flipped nanosheet, in accordance with an embodiment of the present invention. FIG. 10B illustrates a formation of a trench at the exposed top of the flip nanosheet, in accordance with an embodiment of the present invention. The first layer 115 is recessed to form a trench 215 between sections of the filling layer 175. The trench 215 is aligned with the exposed top of the fin after the multilayered device 100 was flipped over.

FIG. 11A illustrates the formation of a hard mask on the exposed surface of the nanosheet, in accordance with an embodiment of the present invention. A hard mask material 220 is formed on the surface of the first dummy gate 155, the covering layer 150, and on the first layer 115. FIG. 11B illustrates filling the trench 215 with the hard mask material 220, in accordance with an embodiment of the present invention. The trench 215 allows for the hard mask material 220 to self-aligned to the top of the fin. The original (prior to flipping) top half of the fin of the multilayer device 100 was processed first to form the desired components. Processing the top half of the fin is easier than processing the entire fin since the top half of the fin has a lower aspect ratio when compared to the entire fin. The aspect ratio of the fin is reduced, because the first dummy gate 155, dividing layer 160, and the filling layer 175 temporally raises the bottom of the fin during the initial processing. When the multilayer device 100 is flipped over and the bottom of the fin is exposed, a hard mask needs to be formed and aligned with the exposed section of the fin. The hard mask material 220 self-aligns to the fin when the hard mask material 220 is deposited because the trench 215 in the first layer 115 allows for the hard mask material 220 to be deposited directly on the fin. The figures appear to illustrate the formation of the hard mask material 220, but the present invention is not meant to be limited to only the formation of the hard mask material 220 in the trench 215. Instead of the only hard mask material 220 filling the trench 215, a plurality of layers of different materials can be deposited with the hard mask material being the top layer. Additionally, a different material besides the hard mask material 220 can be formed in the trench 215, for example, a spacer material can be formed in the trench. Once the hard mask material 220 is deposited on the multilayer device 100, then non-processed side of the multilayer device 100 can be processed.

By forming the hard mask material 220 on the back side allows for the underlying layer to be a Si wafter or silicon on insulator (SOI). However, if the hard mask is formed initially when the layers for the fin are formed, then a stack of dielectric materials buried within the substrate is needed so that the initial hard mask can be formed. Therefore, this method allows for more cost-effective materials to be used and allows for easier manufacturing.

FIGS. 12A and 12B illustrates the processing of the flipped over nanosheet, in accordance with an embodiment of the present invention. The processing of the other side of the multilayer device 100 is adds the necessary electrical components. Some of the processing steps are not illustrated by the drawings. The electrical components formed will mirror the components that were formed on the other side of the fin. Additionally, the electrical components formed in the bottom section can be different electrical components than the electrical components formed in the top section. A second dividing layer 162 is added to separate the upper stack from the lower stack. The second dividing layer 162 prevents the upper and lower stacks from shorting each other out. For example, the first dashed circle 230 is circling a portion of the first electrical component/gate 180B and dashed circle 240 is circling a portion of the second electrical component/gate 182. The second electrical component/gate 182 can be a replacement type of gate structure but cannot be a gate first structure. The second electrical component/gate 182 can be comprised of a second gate metal, where the second gate metal and hi-k dielectric can be the same material or a different material than the first gate metal and hi-k dielectric that is used to form the gate 180B. The second electrical component/gate 182 is sealed with a dielectric layer 190, where the dielectric layer 190 is a high-k dielectric. As with the upper device, the gate metal and hi-k can be recessed and then filled/sealed with a dielectric gate cap 195. This structure also enables self-aligned contacts 280 from the backside.

Figure 13B:
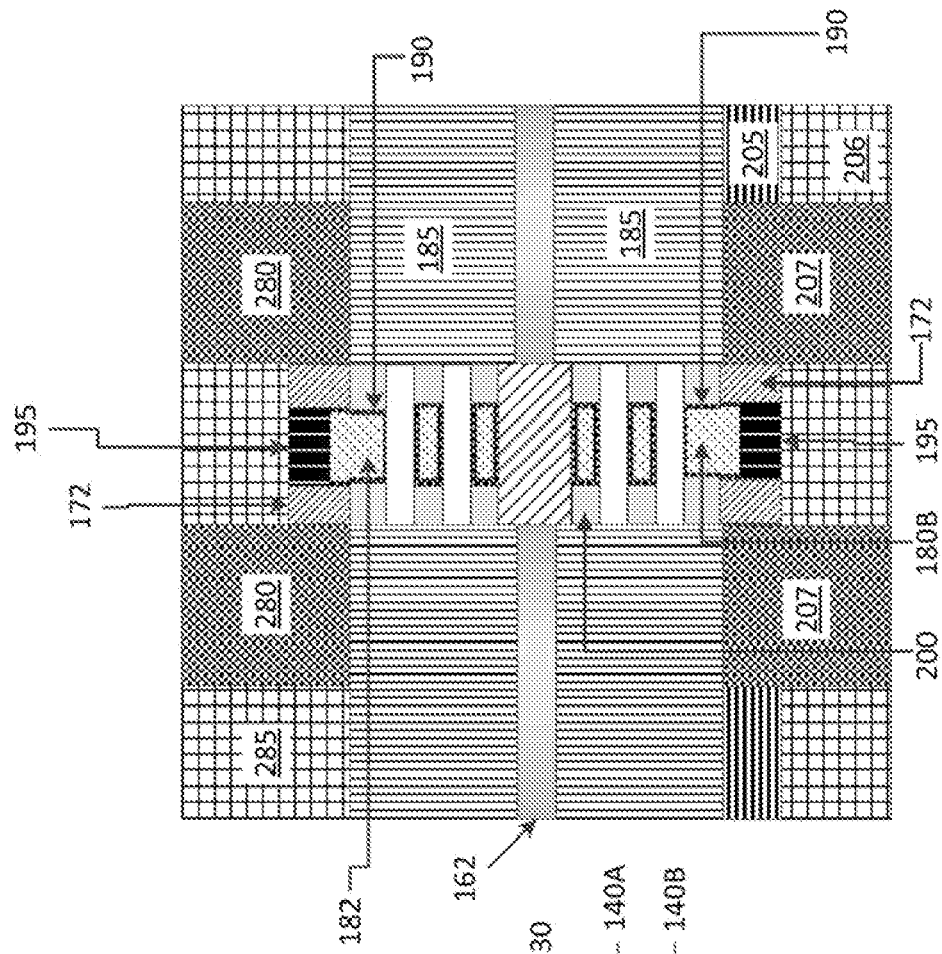
FIGS. 13A and 13B illustrates the processing of the flipped over nanosheet, in accordance with an embodiment of the present invention.
Figure 13A:
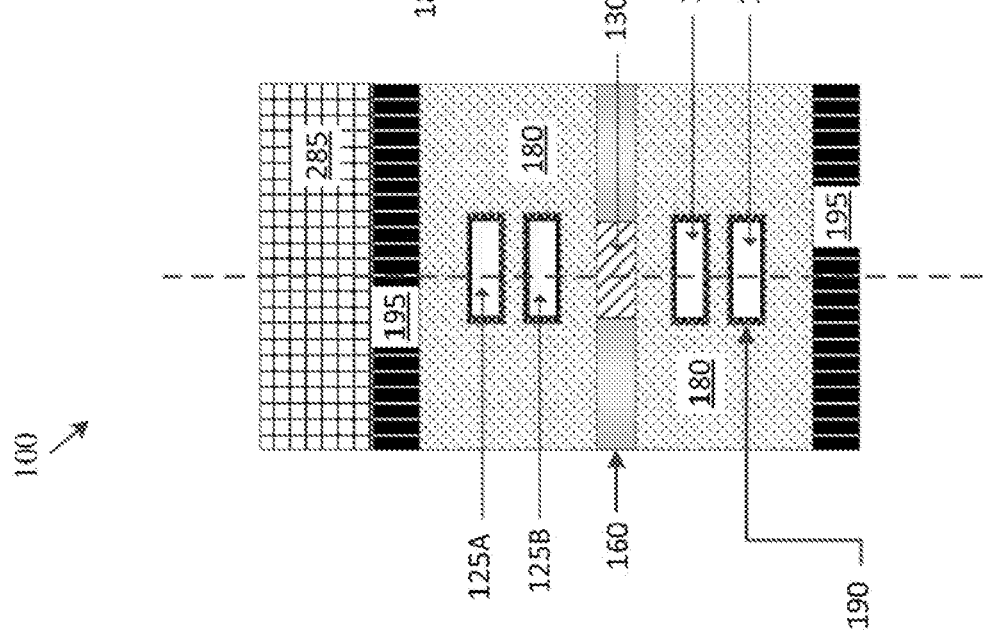

FIGS. 13A and 13B illustrates the processing of the flipped over nanosheet, in accordance with an embodiment of the present invention. A layer 285 is formed and the self-aligned contacts 280 are formed on top of the doping layer 185 in layer 285, where the self-aligned contacts 280 are aligned with the spacer 172. A dielectric would have been present above before the replacement metal gate (RMG) process, and then after RMG another layer 285, for example, a dielectric layer, could be deposited and then self-aligned contacts 280 can be formed. The dielectric material that comprises layer 285 is different than the dielectric material that comprises spacer 172. Furthermore, by utilizing this method allows for the formation backside processing that enables both a self-aligned hard mask and any other self-aligned features, such as spacers, or additional layers of material as needed. The resulting structure is nearly symmetric for the upper and lower devices.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method comprising:
    forming at least one fin on a substrate, wherein the at least one fin has a first section and a second section;
    forming a separating layer on the substrate to isolate the second section of the fin from the first section of the fin, wherein the first section of the fin can be processed while the second section of the fin has been isolated;
    forming as first set of electrical components on the first section of the at least one fin;
    flipping the substrate over and removing the substrate to expose a surface of the second section of the at least one fin;
    removing a portion of the second section of the at least one fin, whereby removing a portion of the second section a trench is created between sections of the separating layer and an exposed portion of the at least one fin; and
    forming a hard mask in the trench.

2. The method of claim 1, wherein the first section is a top portion of the at least one fin, and the second section is a bottom portion of the at least one fin.

3. The method of claim 1, further comprising:
    forming a second set of electrical components on the second section of the at least one the at least one fin.

4. The method of claim 3, wherein forming the first set of electrical components includes forming a first electrical gate by utilizing a gate first method for forming the gate, and wherein forming the second set of electrical components includes forming a second electrical gate by utilizing a replacement gate method for forming the gate.

5. The method of claim 3, further comprising:
    wherein the first set of electrical components are formed using a first gate metal;
    wherein the second set of electrical components are formed using a second gate metal; and
    wherein the first gate metal and the second gate metal are different metals.

6. The method of claim 3, further comprising:
    wherein the first set of electrical components are formed using a first gate metal;
    wherein the second set of electrical components are formed using a second gate metal; and
    wherein the first gate metal and the second gate metal are a same metal.

7. A method comprising:
    forming at least one fin on a substrate, wherein the at least one fin is formed by forming a plurality of different layers on top of each other, wherein the at least one fin has a first section and a second section, wherein the plurality of different layers are epitaxially grown on the substrate;
    forming a separating layer on the substrate to isolate the second section of the fin from the first section of the fin, wherein the first section of the fin can be processed while the second section of the fin has been isolated;
    forming as first set of electrical components on the first section of the at least one fin;
    flipping the substrate over and removing the substrate to expose a surface of the second section of the at least one fin;
    removing a portion of the second section of the at least one fin, whereby removing a portion of the second section a trench is created between sections of the separating layer and an exposed portion of the at least one fin; and
    forming a hard mask in the trench.

8. The method of claim 7, wherein the first section is a top portion of the at least one fin, and the second section is a bottom portion of the at least one fin.

9. The method of claim 7, further comprising:
    forming a second set of electrical components on the second section of the at least one fin.

10. The method of claim 9, further comprising:
    wherein the first set of electrical components are formed using a first gate metal;
    wherein the second set of electrical components are formed using a second gate metal; and
    wherein the first gate metal and the second gate metal are different metals.

11. The method of claim 9, further comprising:
    wherein the first set of electrical components are formed using a first gate metal;
    wherein the second set of electrical components are formed using a second gate metal; and
    wherein the first gate metal and the second gate metal are a same metal.

12. An apparatus comprising:
    a fin, wherein the fin has a first section and a second section;
    a first gate located on the first section, wherein the first gate is a gate first structure; and
    a second gate located on the second section, wherein the second gate is a replacement metal gate structure.

13. The apparatus of claim 12, further comprising:
    an electrical contact located on the second section, wherein the electrical contacts are aligned with the second gate.

14. The apparatus of claim 12, further comprising:
    wherein the first gate is comprised of a first gate metal and the second gate is comprised of a second gate metal; and
    wherein the first gate metal and the second gate metal are different.

15. The apparatus of claim 12, further comprising:
    a first spacer material located on sides of the first gate; and
    a second spacer material located on sides of the second gate, wherein the first spacer material and the second spacer material are comprised of a low-k dielectric material.

16. The apparatus of claim 15, further comprising:
    at least one first contact connected to the first spacer material.

17. The apparatus of claim 15, further comprising:
    at least one second contact connected to the second spacer material.

18. An apparatus comprising:
    a fin, wherein the fin has a first section and a second section;
    a first gate located on the first section, wherein the first gate is a gate first structure;
    at least one first inner spacer is located on the first section, wherein the at least one first inner spacer separates the first gate from a first doped layer;

a second gate located on the second section, wherein the second gate is a replacement metal gate structure; and at least one second inner spacer are located the second section, wherein the at least one second inner spacer separates the second gate from a second doped layer.

19. The apparatus of claim 18, further comprising:

a first hardmask located on top of the first gate; and a first spacer material located on the top of the first gate and sides of the first hardmask.

20. The apparatus of claim 19, further comprising:

a second hardmask located on top of the second gate; and a second spacer material located on the top of the second gate and sides of the second hard mask.

21. The apparatus of claim 20, wherein the at least one first inner spacer and the at least one second inner spacer are comprised of a first low-k dielectric material.

22. The apparatus of claim 21, wherein the first spacer material and the second spacer material are comprised of a second low-k dielectric material and wherein the first low-k dielectric material and the second low-k dielectric material are different.

23. The apparatus of claim 20, further comprising:

a first electrical contact located on the first section, wherein the first electrical contact extends along a surface of the first spacer material, such that, the first electrical contact overlaps with the first gate and the first hardmask.

24. The apparatus of claim 23, further comprising:

a second electrical contact located on the second section, wherein the second electrical contact extends along a surface of the second spacer material, such that, the second electrical contact overlaps with the second gate and the second hardmask.

\* \* \* \* \*